United States Patent
Chetrit

(10) Patent No.: US 12,149,052 B2
(45) Date of Patent: Nov. 19, 2024

(54) METHOD AND DEVICE FOR ALIGNING A LASER AND A WAVEGUIDE

(71) Applicant: DustPhotonics, Modiin (IL)

(72) Inventor: Yoel Chetrit, Kfar Ben Nun (IL)

(73) Assignee: DustPhotonics, Modiin (IL)

( * ) Notice: Subject to any disclaimer, the term of this patent is extended or adjusted under 35 U.S.C. 154(b) by 960 days.

(21) Appl. No.: 15/734,972

(22) PCT Filed: Jun. 3, 2019

(86) PCT No.: PCT/IB2019/054584
§ 371 (c)(1),
(2) Date: Dec. 3, 2020

(87) PCT Pub. No.: WO2019/234589
PCT Pub. Date: Dec. 12, 2019

(65) Prior Publication Data
US 2021/0234339 A1    Jul. 29, 2021

Related U.S. Application Data

(60) Provisional application No. 62/794,808, filed on Jan. 21, 2019, provisional application No. 62/794,815, (Continued)

(51) Int. Cl.
*H01S 5/20* (2006.01)
*G01J 1/42* (2006.01)
(Continued)

(52) U.S. Cl.
CPC .......... *H01S 5/2018* (2013.01); *G01J 1/4257* (2013.01); *G01J 3/02* (2013.01); *G02B 6/4225* (2013.01); *G01J 2003/423* (2013.01)

(58) Field of Classification Search
CPC .......... G02B 2006/12107; G02B 2006/12147; G02B 6/02; G02B 6/4225; G02B 6/4227;
(Continued)

(56) References Cited

U.S. PATENT DOCUMENTS

| 5,699,468 A * | 12/1997 | Farries | H04B 10/25073 |
| | | | 385/140 |
| 2004/0120633 A1 * | 6/2004 | Gao | G02B 6/42 |
| | | | 385/14 |

(Continued)

FOREIGN PATENT DOCUMENTS

| JP | 2004219786 A | 8/2004 |
| JP | 2005134444 A | 5/2005 |

*Primary Examiner* — Tarifur R Chowdhury
*Assistant Examiner* — Roberto Fabian, Jr.
(74) *Attorney, Agent, or Firm* — Reches Patents

(57) ABSTRACT

A device and a method for aligning a laser unit to a waveguide unit. The method may include (a) placing the laser unit in a tested position in which the laser unit faces the waveguide unit;(b) supplying light, via a coupler of the waveguide unit, to an alignment waveguide of the waveguide unit; (c) receiving light emitted from the alignment waveguide; wherein the light was emitted as result of the supplying of the light; (d) determining whether the light emitted from the alignment comprises a spectral signature associated with an alignment unit of the laser unit; and (e) estimating whether the laser unit is aligned to the waveguide unit based on the determining of step (d).

24 Claims, 13 Drawing Sheets

Related U.S. Application Data filed on Jan. 21, 2019, provisional application No. 62/679,824, filed on Jun. 3, 2018.

(51) Int. Cl.
*G01J 3/02* (2006.01)
*G01J 3/42* (2006.01)
*G02B 6/42* (2006.01)

(58) Field of Classification Search
CPC ....... G01N 2201/08; G09G 2340/0464; G01B 11/27; G01M 11/30; G01M 11/35; G01M 11/33; G02F 1/365; G01J 2003/423; G01J 3/02; H01S 5/2018
See application file for complete search history.

(56) References Cited

U.S. PATENT DOCUMENTS

| | | | | |
|---|---|---|---|---|
| 2004/0156575 | A1* | 8/2004 | Samara-Rubio | G02B 6/124 385/12 |
| 2010/0074282 | A1* | 3/2010 | Oh | G02B 6/124 372/20 |
| 2011/0116735 | A1* | 5/2011 | Baets | G01D 5/268 385/12 |
| 2012/0327754 | A1* | 12/2012 | Olson | G11B 5/105 372/50.1 |
| 2014/0099059 | A1* | 4/2014 | Pommer | G02B 6/4201 385/33 |
| 2016/0363728 | A1* | 12/2016 | Wang | G01N 21/03 |

* cited by examiner

METHOD AND DEVICE FOR ALIGNING A LASER AND A WAVEGUIDE

CROSS REFERENCE

This application claims priority from the following US provisional patents—all being incorporated herein in their entirety:
a. U.S. provisional patent 62/679,824 filing date Jun. 3, 2018;
b. U.S. provisional patent 62/794,815 filing date Jan. 1, 2019;
c. U.S. provisional patent 62/794,808 filing date Jan. 21, 2019.

BACKGROUND

A waveguide is used to convey radiation that is outputted by a laser. The waveguide and the laser are usually included in different parts of a device.

The waveguide must be aligned to the laser in order to properly convey the light outputted by the laser.

In order to align the waveguide to the laser the laser may be activated, may be induced to output radiation, and the radiation that passes through the waveguide may be measured—in order to determine the alignment.

The activation of the laser during the alignment process may be costly and otherwise problematic—especially in devices that are manufactured in mass production.

There may be a growing need for an efficient device and method for aligning a laser and a waveguide.

SUMMARY

There may be provided a method for aligning a laser unit to a waveguide unit, the method may include (a) placing the laser unit in a tested position in which the laser unit faces the waveguide unit; (b) supplying light, via a coupler of the waveguide unit, to an alignment waveguide of the waveguide unit; (c) receiving light emitted from the alignment waveguide, wherein the light was emitted as result of the supplying of the light; (d) determining whether the light emitted from the alignment may include a spectral signature associated with an alignment unit of the laser unit; and (e) estimating whether the laser unit may be aligned to the waveguide unit based on the determining.

The supplying of the light and the receiving of the light while the laser unit may be deactivated, idle or otherwise non-active. The alignment is not based on a transmission of light by the laser.

The method may include changing the tested position and jumping to supplying the light when determining that the laser unit may be misaligned to the waveguide unit.

The method may include evaluating an amount of light that exited the coupled of the waveguide unit. Thus—if the supply is not sufficient due to misalignment between the source of light and the waveguide unit—the waveguide unit and/or the supplying element may be moved or otherwise be glued be better optically coupled to the alignment waveguide.

The alignment unit may from a laser of the laser unit.
The alignment unit may be the laser of the laser unit.
The alignment waveguide may differ from a main waveguide that may be allocated for conveying radiation transmitted from a laser of the laser unit.

The method may include attenuating light that passed through the alignment unit.

The method may include attenuating light that passed through the alignment unit by an attenuating material that follows the alignment unit.

The method may include attenuating light that passed through the alignment unit by a scattering element that follows the alignment unit.

The method may include attenuating light that passed through the alignment unit by a termination of the alignment waveguide after the alignment unit.

The alignment unit may be a first Bragg grating.

The alignment unit may be a first Bragg grating and wherein the method may include attenuating light that passed through the first Bragg grating by a second Bragg grating.

The method may include gluing the laser unit to a laser carrier following a completion of an alignment of the laser unit to the waveguide unit.

There may be provided a device that may include a laser unit and a waveguide unit. The laser unit may include a laser and an alignment unit. The waveguide unit may include an alignment waveguide and a coupler. The coupler may be configured to receive light from a light source and to provide the light to the alignment waveguide. The alignment waveguide may be configured to direct the light towards the laser unit. When aligned to the waveguide unit the alignment unit may be configured to reflect light having a spectral signature of the alignment unit towards the alignment waveguide. When misaligned to the waveguide unit the laser unit may be configured to reflect light without the spectral signature of the alignment unit towards the alignment waveguide. The alignment waveguide may be configured to direct the reflected light towards the coupler. The coupler may be configured to direct the reflected light towards a detector.

The supplying of the light and the receiving of the light while the laser unit may be deactivated.

The device may include changing the tested position and jumping to supplying the light when determining that the laser unit may be misaligned to the waveguide unit.

The device may include evaluating an amount of light that exited the coupled of the waveguide unit.

The alignment unit may differ from a laser of the laser unit.

The alignment unit may be the laser of the laser unit.

The alignment waveguide may differ from a main waveguide that may be allocated for conveying radiation transmitted from a laser of the laser unit.

The device may include attenuating light that passed through the alignment unit.

The device may include attenuating light that passed through the alignment unit by an attenuating material that follows the alignment unit.

The device may include attenuating light that passed through the alignment unit by a scattering element that follows the alignment unit.

The device may include attenuating light that passed through the alignment unit by a termination of the alignment waveguide after the alignment unit.

The alignment unit may be a first Bragg grating.

The alignment unit may be a first Bragg grating and wherein the method may include attenuating light that passed through the first Bragg grating by a second Bragg grating.

The device may include gluing the laser unit to a laser carrier following a completion of an alignment of the laser unit to the waveguide unit.

BRIEF DESCRIPTION OF THE DRAWINGS

The subject matter regarded as the invention is particularly pointed out and distinctly claimed in the concluding portion of the specification. The invention, however, both as to organization and method of operation, together with objects, features, and advantages thereof, may best be understood by reference to the following detailed description when read with the accompanying drawings in which:

DETAILED DESCRIPTION OF THE DRAWINGS

Figure 1:
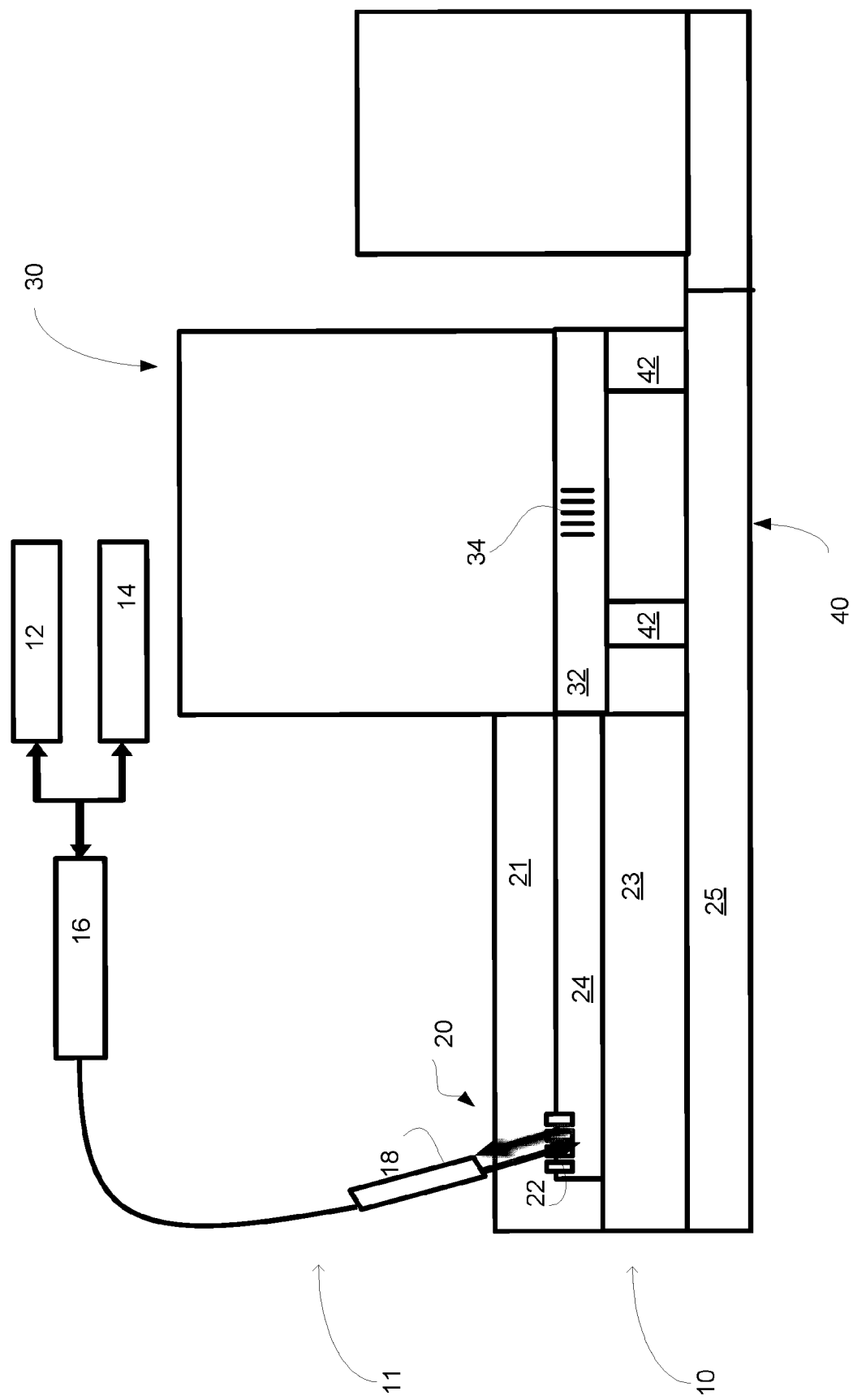
FIG. 1 is an example of testing equipment and of a device that includes a laser and one or more alignment units.

In the following detailed description, numerous specific details are set forth in order to provide a thorough understanding of the invention. However, it will be understood by those skilled in the art that the present invention may be practiced without these specific details. In other instances, well-known methods, procedures, and components have not been described in detail so as not to obscure the present invention.

The subject matter regarded as the invention is particularly pointed out and distinctly claimed in the concluding portion of the specification. The invention, however, both as to organization and method of operation, together with objects, features, and advantages thereof, may best be understood by reference to the following detailed description when read with the accompanying drawings.

It will be appreciated that for simplicity and clarity of illustration, elements shown in the figures have not necessarily been drawn to scale. For example, the dimensions of some of the elements may be exaggerated relative to other elements for clarity. Further, where considered appropriate, reference numerals may be repeated among the figures to indicate corresponding or analogous elements.

Because the illustrated embodiments of the present invention may for the most part, be implemented using electronic components and circuits known to those skilled in the art, details will not be explained in any greater extent than that considered necessary as illustrated above, for the understanding and appreciation of the underlying concepts of the present invention and in order not to obfuscate or distract from the teachings of the present invention.

There is provided a method and device for alignment. The device includes a first part that include the waveguide (waveguide unit) and a second part that includes the laser (laser unit). The first and second parts may be integrated circuits—such as waveguide integrated circuit (IC) and a laser IC (or any type of IC).

The laser IC has a first end that faces the waveguide IC and a second end that may include a mirror. The mirror may extend through the entire laser IC and reflects any light that reaches the mirror from the waveguide IC.

The mirror may prevent to test the alignment of the laser without activating the laser—because the mirror reflects wide bandwidth which will include both the probe and the signal wavelength. (substantially all the light it receives) and do not provide a reliable indication about the spatial relationship between the laser and the waveguide. Furthermore—on top of the mirror, the active layer has a very strong absorption, which also limits the alignment.

The laser IC may be manufactured to include one or more alignment units (alignment units) that exhibit a frequency selective response—have a unique spectral signature (also referred to as signature)—once the waveguide is aligned to the one or more alignment units.

An alignment unit may be included in the laser—or may be spaced apart from the laser-while maintaining a known spatial relationship with the laser.

The known spatial relationship may be, for example, having the alignment unit located at a known displacement (over one or more axes) from the laser.

After the waveguide and the alignment units are aligned—the alignment process may proceed by introducing a relative movement between the laser IC and the waveguide IC to compensate for the known spatial relationship.

There may be provided multiple alignment units that are located in a multiple planes to enable alignment along multiple axes (for example along two axes that are orthogonal to each other or otherwise non-parallel to each other).

Alternatively—when the alignment units is spaced apart from the laser—the waveguide IC may include multiple waveguides—including an alignment waveguide that once aligned with the alignment unit—another waveguide of the waveguide IC—is aligned with the laser. The other waveguide will be used to cover light from the laser.

The alignment unit may include a band pass filter, a Bragg grating, and the like—that may have a spectral response that appears once illuminated by a waveguide that is aligned to the alignment unit.

The alignment unit may reflect towards the waveguide light of certain frequencies—while not reflecting other frequencies (to provide distinguishable spectral response). There other frequencies should not be returned (or at least should not be returned without being significantly attenuated) by the mirror towards the alignment unit and then to the waveguide.

This may be obtained by having attenuating materials or attenuating circuits between the mirror and the alignment unit, and/or by scattering the radiation at different directions—thereby reducing (and even eliminating) the reflected radiation from the mirror towards the waveguide.

FIG. 1 is an example of testing equipment 11 and of a device 10 that includes a laser unit 30 and a waveguide unit 20.

Light from a light source 12 propagates through a power splitter 16 and then exits a lightguide 18, impinges on a coupler 22 of the waveguide unit 20, enters an alignment waveguide 24 and propagates (via laser unit alignment waveguide 32) towards an alignment unit such as but not limited to a first Bragg grating 34.

During the alignment process the laser may be passive (even not connected) and light reflected from the alignment unit 34 may be reflected towards the coupler 22 and may propagate through lightguide 18 towards coupler 22 and then to detector 14.

FIG. 1 also illustrate various parts of device 10—an oxide layer (such as BE oxide layer) 21, BOX layer 23, silicon substrate 25, supporting legs 42.

Figure 2:
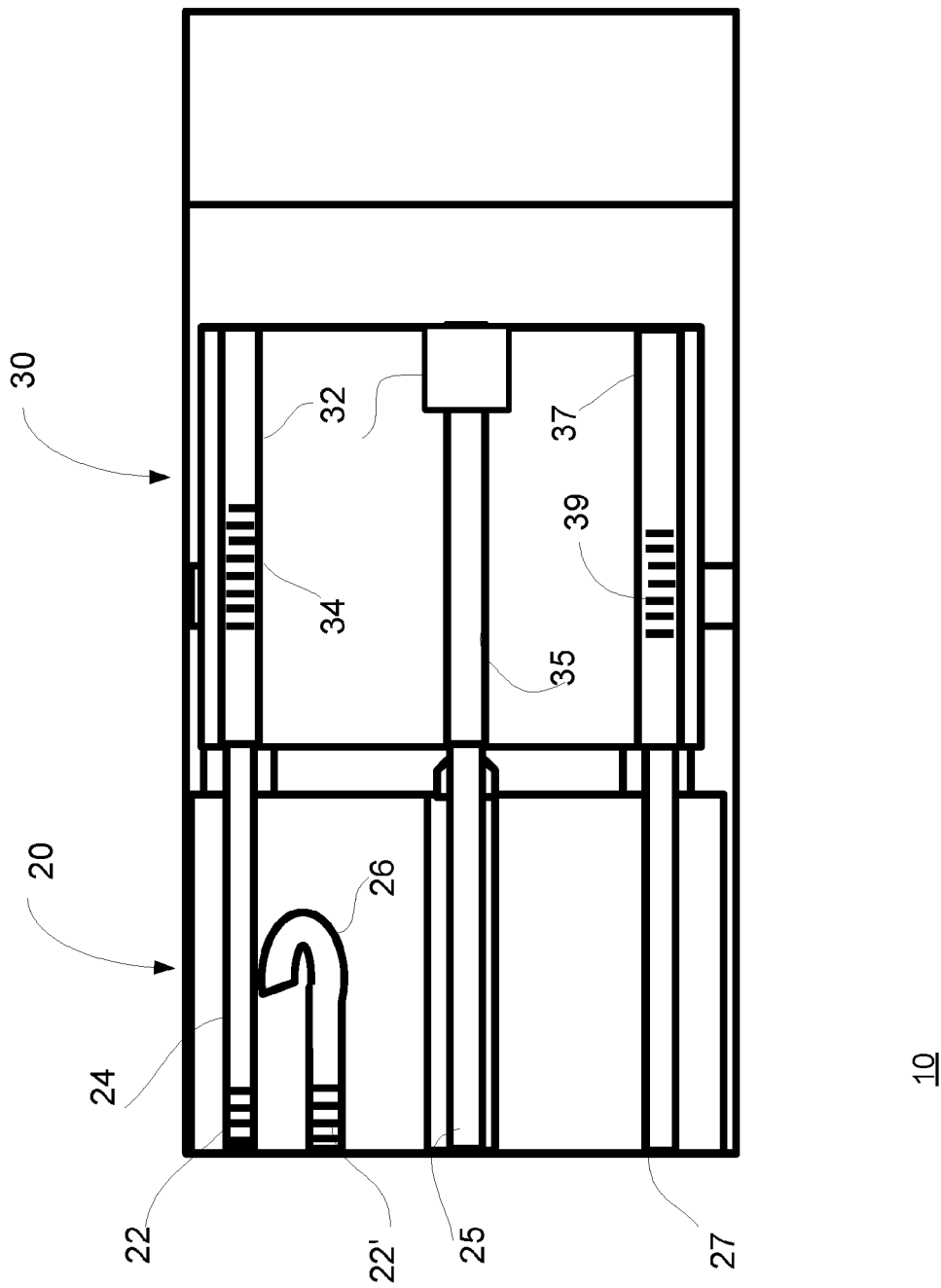
FIG. 2 is an example of a device that includes a laser and one or more alignment units.

FIG. 2 is an example of a laser unit 30 and one or more alignment units 34 and 39. In FIG. 2 the laser unit 30 includes two laser unit alignment waveguides 32 and 37 that are positioned at both side of a main waveguide 25 (over which the transmissions from laser 32 propagate) and two alignment units 34 and 39 (one per each laser unit alignment waveguide). The laser unit alignment waveguides 32 and 37 are located at a known distance from the laser. There may be only one alignment unit, or more than two alignment units.

Once one or more of the alignment waveguides 24 and 27 of the waveguide unit are aligned to the corresponding laser unit alignment waveguides 32 and 37 the light from the testing equipment will be reflected back to the testing equipment and will include the signature of one or more of the alignment units 34 and 39 respectively.

Once alignment is achieved the main waveguide 35 of the laser unit is aligned with the main waveguide 25 of the waveguide unit—and the waveguide unit is deemed to be aligned with the laser unit.

In FIG. 2 light that passes through the first alignment waveguide 24 is sampled by coupler 26 and may be sent back to a measurement unit in order to monitor the optical coupling between the light guide 18 and the first alignment waveguide 24.

The coupler may be a coupler MIM or any type of power monitor. It can also be a photo detector integrated in the waveguide unit for measuring the light from the lightguide that is fed to the alignment waveguide—and it is used for aligning the lightguide and the alignment waveguide.

Either one of the alignment units may be illuminated during an alignment process—and the reflected light may exhibit the distinguishable spectral response—when aligned with the alignment waveguide.

Figure 3:
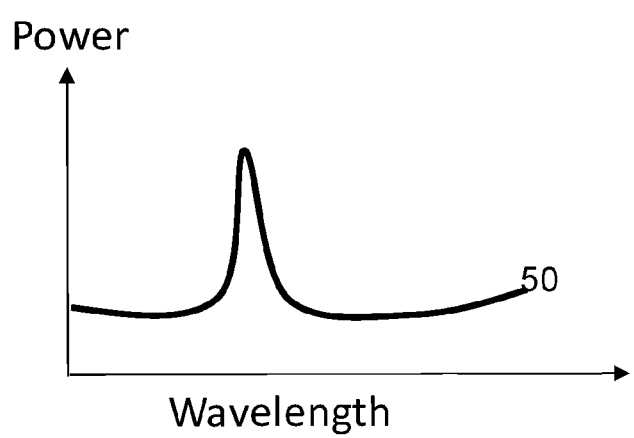
FIG. 3 is an example of a spectral response of an alignment unit and corresponding circuits.

FIG. 3 is an example of a spectral response 50 of an alignment unit and corresponding circuits. In this spectrum we can define a signal which will be the pick reflected wavelength—obeying the Bragg condition, and a probe which will not be reflected by the grating. The ratio between the signal and the probe can provide an accurate information about the spatial position with respect to the alignment unit.

This a response of a band pass filter. Any other distinguishable spectral response may be provided. In this example, we can select two wavelength: one to be a signal wavelength which will be aligned with the pick reflectance/spectral response of the alignment unit, and $2^{nd}$ wavelength will act as a probe which will not be reflected back. The ratio between the signal and probe could be an indication to the spatial position of the two units.

Each auxiliary waveguide may include one or more Bragg gratings—for example two Bragg gratings. The first one reflects towards the waveguide IC some of the frequencies—while other frequencies propagate towards the second grating and are scattered by the second grating—in order to attenuate any frequency component of these other frequencies that propagates back to the waveguide IC.

Assuming layer transparency improves due to laser open circuit conditions. Photons absorbed in the QW generate electron holes pairs which may effectively charge the open circuit laser diode. As a result the absorption reduces, and reflected signal from the laser grating could be sensed. Laser includes a grating and light may penetrate and be selectively reflected.

One more concept would be to use optical pumping of the laser. In this case we can illuminate the laser from top/bottom or along the optical axes with shorter wavelength which will cause optical pumping effect. This pumping will generate light at the unit laser wavelength which can be detected.

Using regrowth (etch a layer of the laser and grow a transparent layer) or any other process, waveguide and pattern with grating which will generate strong and narrow wavelength reflection.

Transmitted light (non Bragg wavelength) will be either (a) absorbed in the QW waveguide or (b) scattered using $2^{nd}$ grating coupler structure united to scatter light up/down.

It should be noted that the laser high absorption is for the unit wavelength of the laser. The alignment may involve using the laser as the alignment unit while using a different wavelength for which the QW will be relatively transparent. That wavelength could be reflected from a higher/lower order of the laser Brag grating, or a dedicated grating built into adjacent alignment structure/channel. This may allow to use lasers as an alignment unit without the regrowth process of a non-attenuating layer. This may provide a significant cost reduction.

Figure 4:
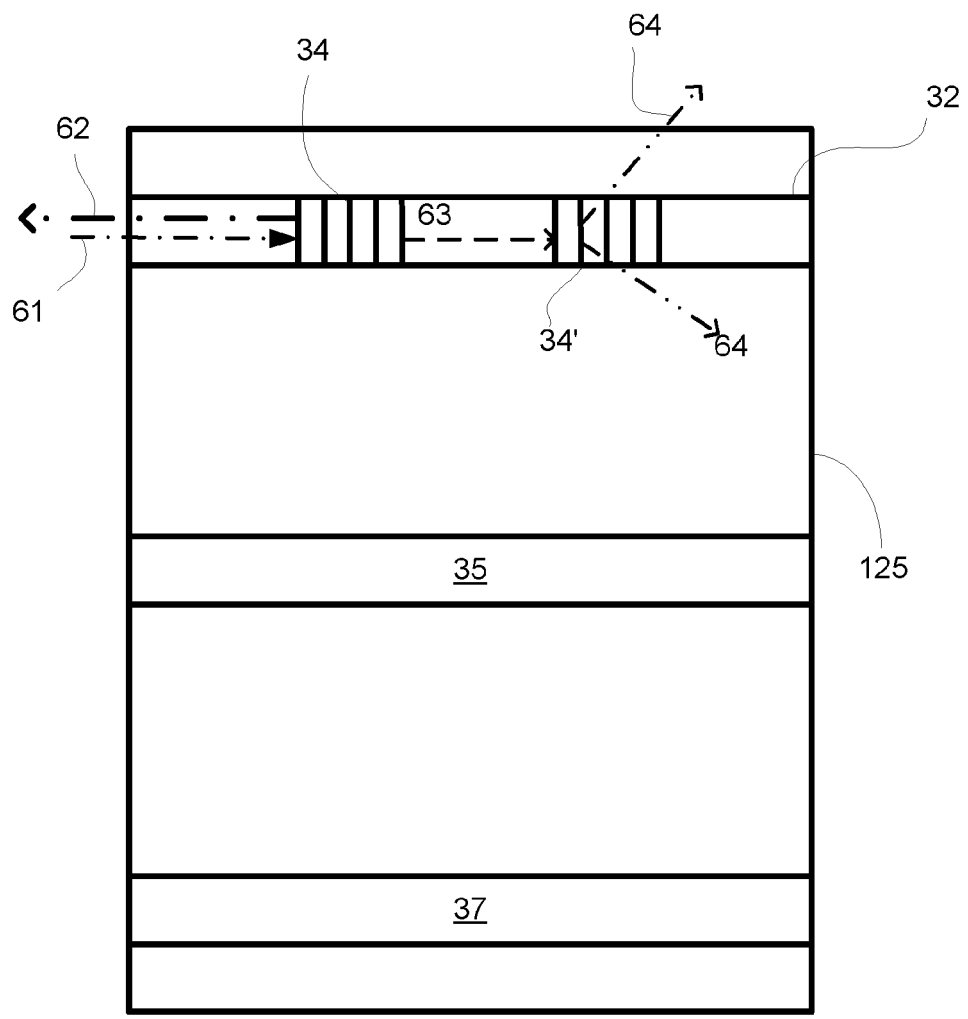
FIG. 4 is an example laser unit that includes one or more alignment units.

FIG. 4 is an example of a laser unit 30 that includes laser unit alignment waveguides 32 and 37, alignment unit such as first Bragg grating 34, laser unit main waveguide 35 and a second Bragg grating 35. For simplicity of explanation the laser unit alignment waveguide 37 is shown without an alignment unit.

The second Bragg Grating 34' follows first Bragg grating 34.

Light 61 reaches laser unit alignment waveguides 32 and impinges on first Bragg grating 34. The first Bragg grating 34 operates as a mirror which provide a reflected signal 62. The second Bragg grating 34' scatters (64) or absorbs all (or a significant amount of) wavelengths 63 that were not reflected by the first Bragg grating, and prevent it from reaching the back wide band mirror 125. The existence of the second Bragg grating 34' section could provide a better signal to noise ratio, but is not mandatory for the detection of the reflected signal.

The second Bragg grating is an example of a scattering or absorbing or attenuating unit.

The first Bragg grating may reflects specific wavelengths back into an alignment waveguide of the waveguide unit. The second Bragg grating may be use to scatter the other wavelengths toward the substrate of the laser IC (for example to locations outside the plane of FIG. 4—this will improve the signal to noise ratio of the reflected light.

FIG. 4 is an example of a laser unit 30 that includes laser unit alignment waveguides 32 and 37, alignment unit such as first Bragg grating 34, laser unit main waveguide 35 and a second Bragg grating 35. For simplicity of explanation the laser unit alignment waveguide 37 is shown without an alignment unit.

Figure 5:
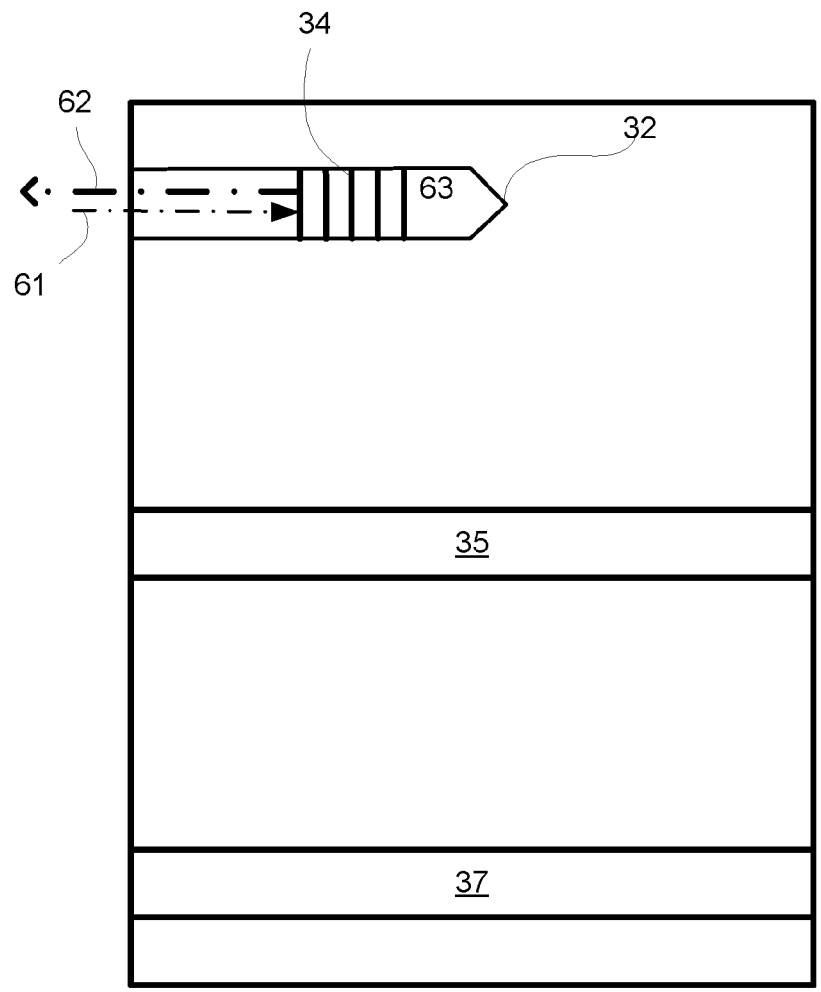
FIG. 5 is an example laser unit that includes one or more alignment units.
Figure 6:
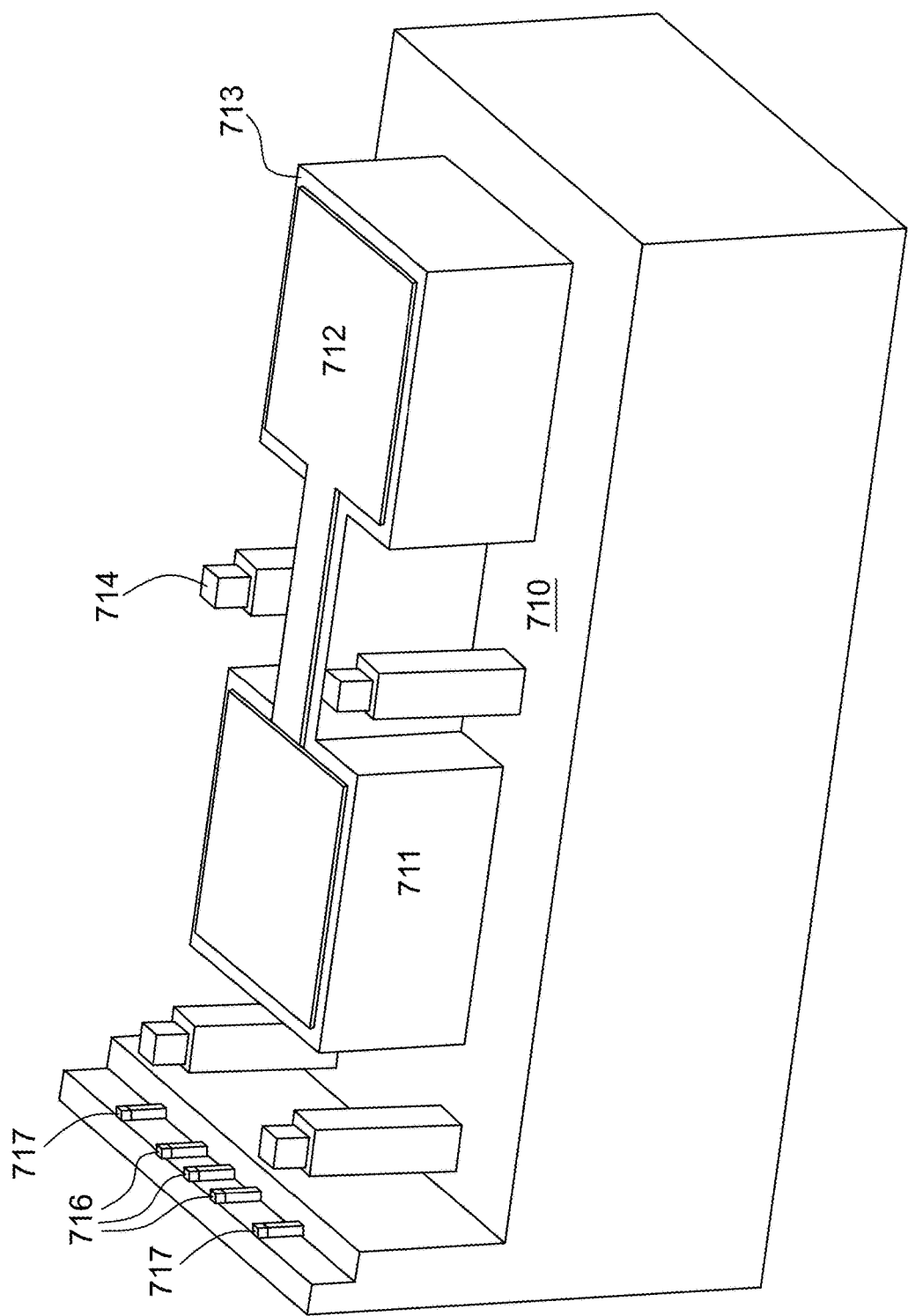
FIGS. 6-9 are an examples a laser, a laser currier and a waveguide unit.
Figure 7:
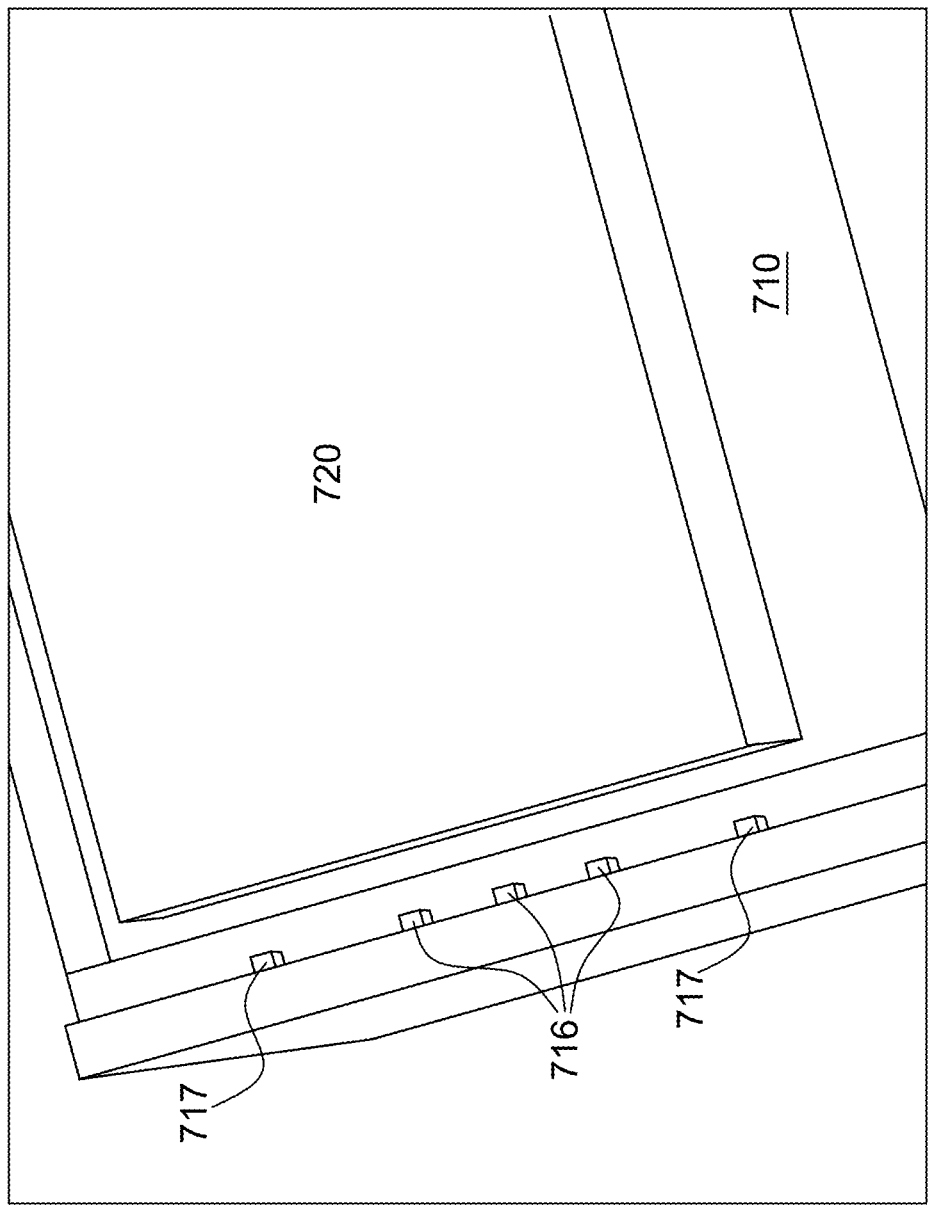
Figure 8:
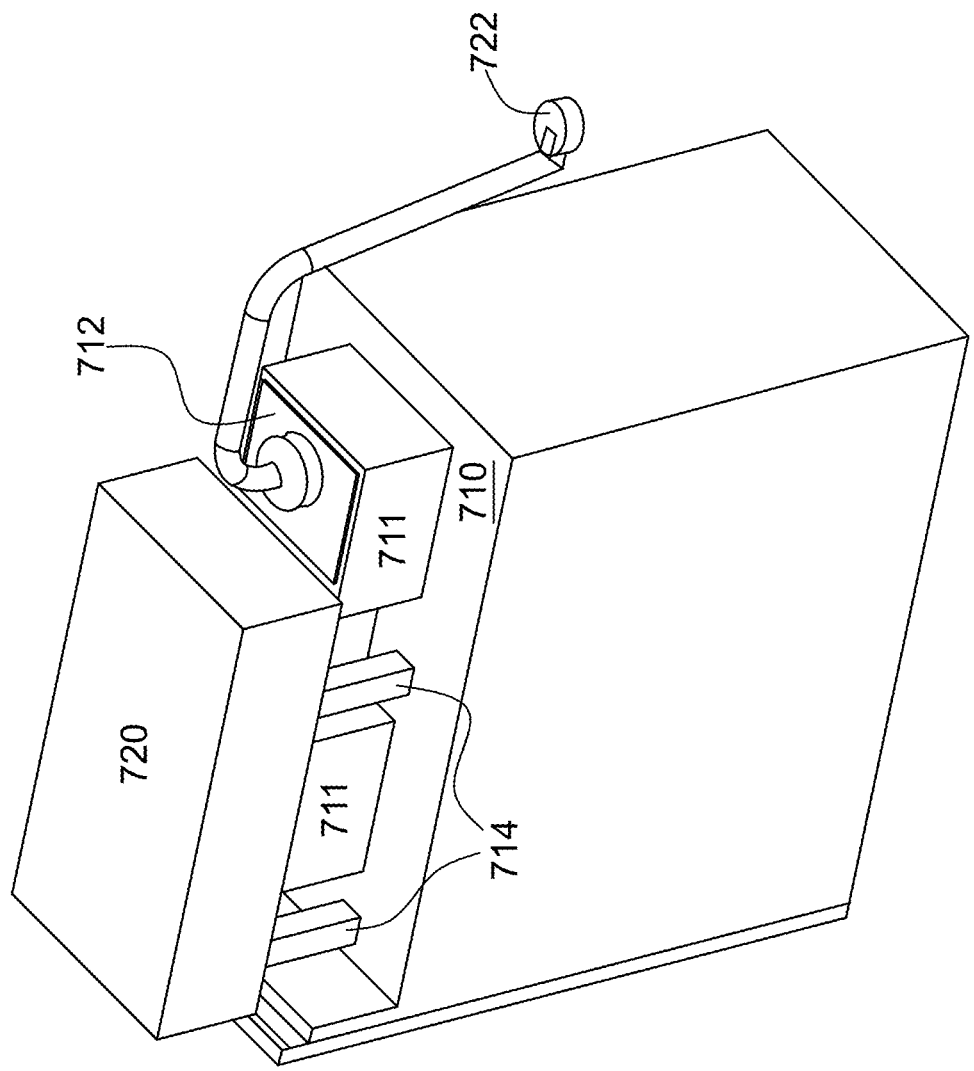
Figure 9:
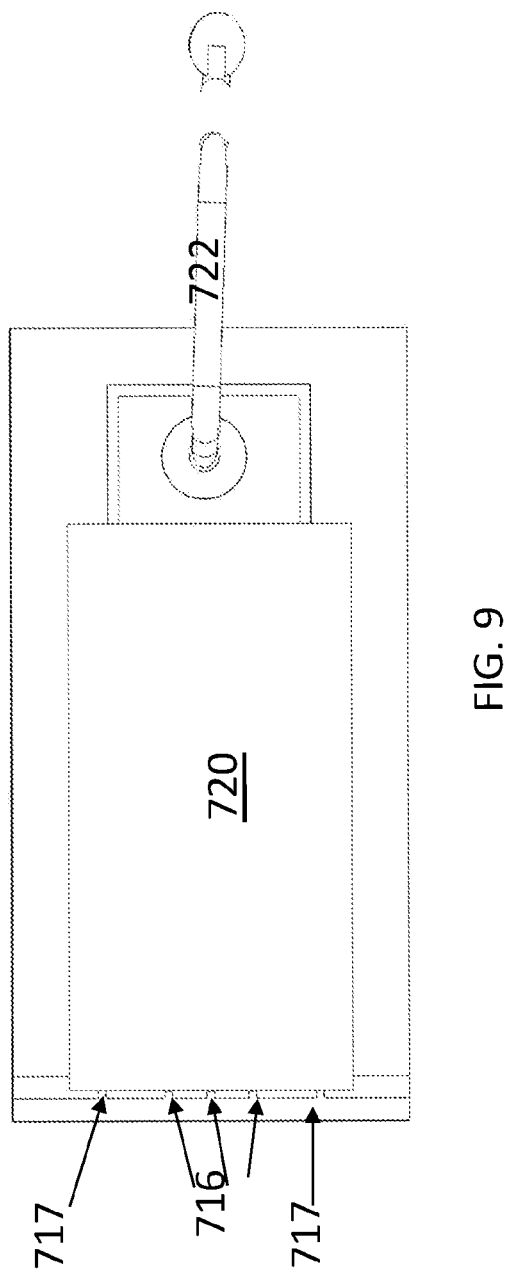

FIG. 5 is an example of a laser unit 30 that includes laser unit alignment waveguides 32 and 37, alignment unit such as first Bragg grating 34, laser unit main waveguide 35 and a second Bragg grating 35. For simplicity of explanation the laser unit alignment waveguide 37 is shown without an alignment unit.

The first laser unit alignment waveguides 32 is terminated and does not reach the end of the laser unit—thus at least a part of the radiation that passes the first Bragg grating 34 may be scattered or attenuated instead of returning towards the waveguide unit.

FIGS. 6-9 illustrates an example of a laser 720 mounted on a laser carrier.

The laser carrier includes:

a. A base 710.

b. Supporting elements such as four vertical bars 714 that extend from the base and have upper ends that contact the laser and support the laser. The upper ends are positioned within a plane. Positioning the laser on the upper ends aligns the laser to the plane. The plane may be a horizontal plane or another plane.

c. Elevated structure 711 that elevates above the base 710. A first part of the elevated structure has sidewalls that are confined within an imaginary region that corresponds to the base of the laser—so that once the laser is positioned on the upper ends, the sidewalls of the first part do not extend to the side of the laser.

d. A insulator 713 positioned on the top of the elevated structure—of forming a part of the top of the elevated structure. The insulator isolates the conductive pad from the elevated structure and prevents cross talk (through adjacent insulating structures) between adjacent lasers.

e. Conductive pad 712 that is positioned on top of the insulator. The conductive pad is electrically coupled to a terminal of the laser by an coupling material that is placed on at least a first part of the pad and a bottom of the laser. The coupling material may also glue the laser to the laser carrier. Because the conductive pad 712 is positioned on top of the elevated structure—excess coupling material does not aggregate and touches the sidewalls of the laser—and do not cause the laser to malfunction. The excess material may fall from the conductive pad/sidewalls of the elevated structure.

f. Bond wire 722 that is electrically coupled to the second part of the conductive pad—for supplying signals to the laser via the conductive pad.

g. Waveguides 716—such as three waveguides—a middle waveguide through which the laser will output signals after being aligned, and two side optical waveguides that point to alignment units for aligning the laser.

h. Mechanical bumps 717 that are slightly longer than waveguides 716- for contacting the laser and maintaining a micron scale distance between the laser and the waveguides 716. A glue with an appropriate optical refraction index may be placed between the laser and the waveguides 716.

In FIGS. 6-9 the conductive pad includes two rectangular regions that are connected to each other by a thinner line. Other shapes may be provided.

Figure 10:
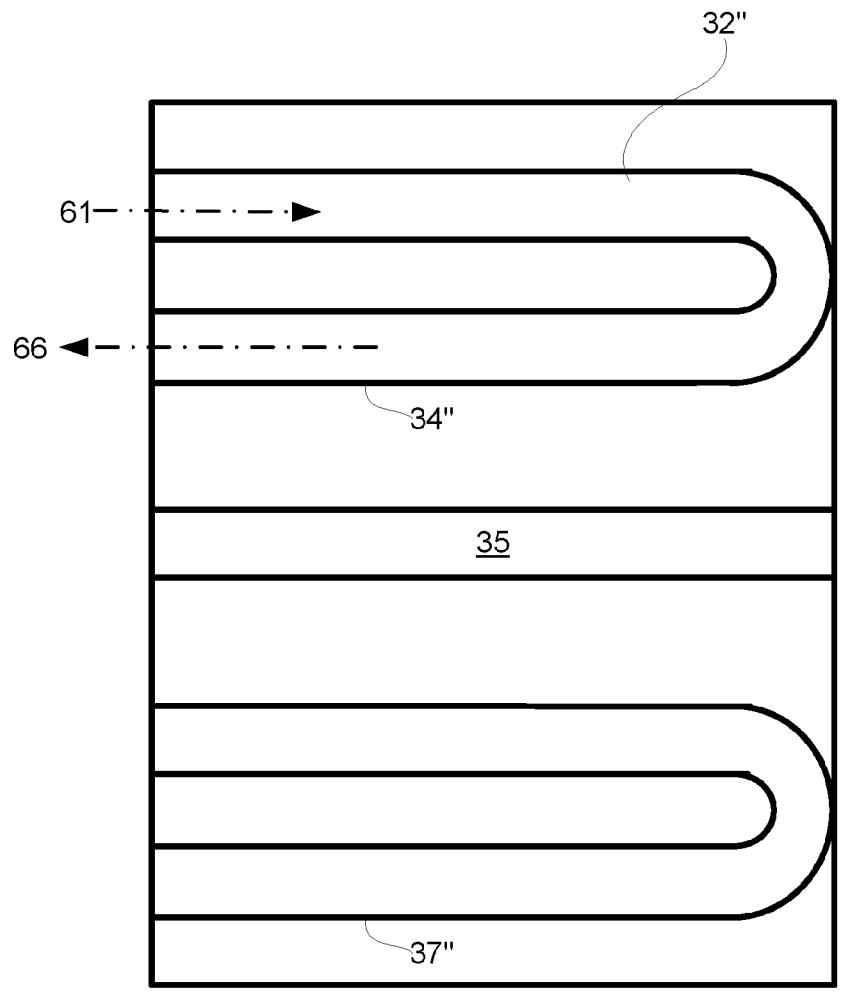
FIG. 10 is an example laser unit that includes one or more alignment units.

FIG. 10 is an example of a laser unit 30 that includes laser unit alignment waveguide 32", laser unit main waveguide 35 and laser unit alignment waveguide 37".

Both laser unit waveguide units may return the radiation—even without substantially changing the spectrum of the radiation. The emitted light may be fully returned to the waveguide unit. This example illustrates a simple power signal looped back by any means in the laser photonics integrated circuit (PIC).

Figure 11:
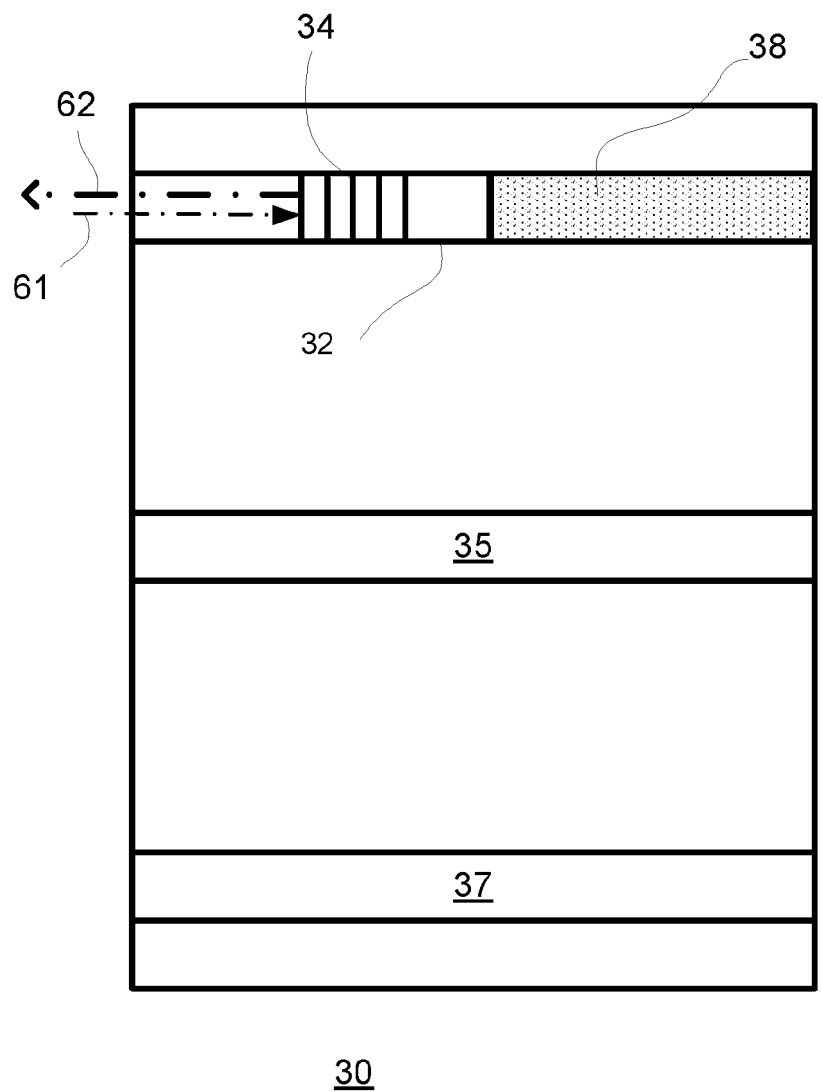
FIG. 11 is an example laser unit that includes one or more alignment units.

In FIG. 11 a Bragg grating is followed by attenuating material 38 or any absorbing/scattering optical element such as bended/scattering waveguide.

The elimination/scattering of the probe wavelength is a key element for high signal to probe extinction ratio.

The attenuating material can be made of QW. Wavelength which will not be reflected from the Bragg grating, will be highly attenuated absorbed by the attenuating material.

The attenuating material may include a combination of a material from column 3 of the periodic table and a material from column 5 of the periodic table.

Figure 12:
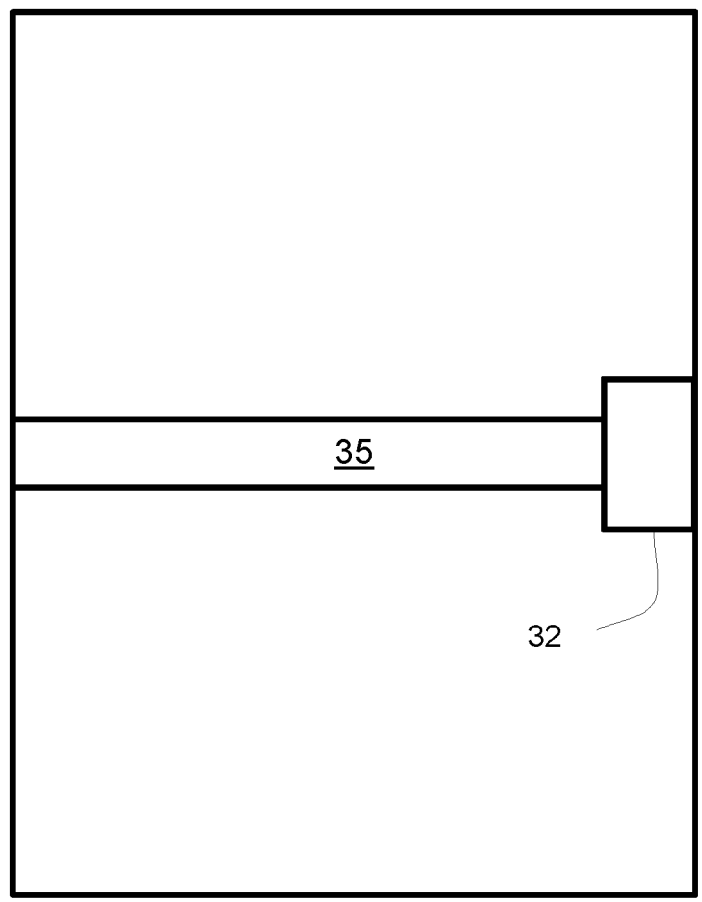
FIG. 12 is an example laser unit.

FIG. 12 illustrates a laser unit in which the laser 32 and the main waveguide are provided and the laser, one illuminated, outputs (even when passive) a radiation of a certain spectral signature that differs from the light reflected from other parts of the laser unit. The main waveguide should be aligned to a corresponding main waveguide of the waveguide unit.

These figures demonstrate two possible methods to make sure the non-reflected light will be absorbed or scattered before it bunches back from the back mirror. This can be obtained using a $2^{nd}$ type of Bragg mirror which can reflect the light in a normal direction to the chip surface. Alternatively—there may be sued tapers down the waveguide width below the critical confinement width. Small radius bended waveguide can be used as well.

Figure 13:
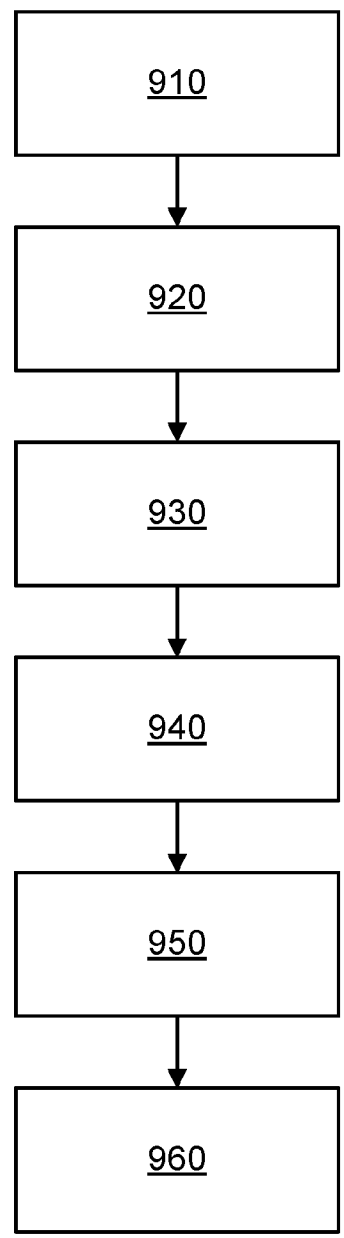
FIG. 13 is an example of a method.

FIG. 13 illustrates method 900.

Method 900 may be for aligning a laser unit to a waveguide unit, the method may include:

a. Placing the laser unit in a tested position in which the laser unit faces the waveguide unit. 910 b. Supplying light, via a coupler of the waveguide unit, to an alignment waveguide of the waveguide unit. 920 c. Receiving light emitted from the alignment waveguide, wherein the light was emitted as result of the supplying of the light. 930 d. Determining whether the light emitted from the alignment includes a spectral signature associated with an alignment unit of the laser unit. 940 e. Estimating whether the laser unit is aligned to the waveguide unit based on the determining. 950 f. Responding to the determination. 960

If, for example, finding the signature then determining that an alignment was obtained.

If, for example, not finding the signature, then determining that alignment was not obtained. This may be followed by selecting a new tested position and then jumping to step 920.

The supplying of the light and the receiving of the light while the laser unit may be deactivated, idle or otherwise non-active. The alignment is not based on a transmission of light by the laser.

The method may include changing the tested position and jumping to supplying the light when determining that the laser unit may be misaligned to the waveguide unit.

The method may include evaluating an amount of light that exited the coupled of the waveguide unit. Thus—if the supply is not sufficient due to misalignment between the source of light and the waveguide unit—the waveguide unit and/or the supplying element may be moved or otherwise be glued be better optically coupled to the alignment waveguide.

The alignment unit may from a laser of the laser unit.

The alignment unit may be the laser of the laser unit.

The alignment waveguide may differ from a main waveguide that may be allocated for conveying radiation transmitted from a laser of the laser unit.

The method may include attenuating light that passed through the alignment unit.

The method may include attenuating light that passed through the alignment unit by an attenuating material that follows the alignment unit.

The method may include attenuating light that passed through the alignment unit by a scattering element that follows the alignment unit.

The method may include attenuating light that passed through the alignment unit by a termination of the alignment waveguide after the alignment unit.

The alignment unit may be a first Bragg grating.

The alignment unit may be a first Bragg grating and wherein the method may include attenuating light that passed through the first Bragg grating by a second Bragg grating.

The method may include gluing the laser unit to a laser carrier following a completion of an alignment of the laser unit to the waveguide unit.

The terms "including", "comprising", "having", "consisting" and "consisting essentially of" are used in an interchangeable manner. For example- any module or chip may include at least the components included in the figures and/or in the specification, only the components included in the figures and/or the specification.

Any reference to the phrases "may" or "may be" should be applied to the phrases "may not" or "may not be".

The phrase "and/or" means additionally or alternatively.

In the foregoing specification, the invention has been described with reference to specific examples of embodiments of the invention. It will, however, be evident that various modifications and changes may be made therein without departing from the broader spirit and scope of the invention as set forth in the appended claims.

Moreover, the terms "front," "back," "top," "bottom," "cover," "under" and the like in the description and in the claims, if any, are used for descriptive purposes and not necessarily for describing permanent relative positions. It is understood that the terms so used are interchangeable under appropriate circumstances such that the embodiments of the invention described herein are, for example, capable of operation in other orientations than those illustrated or otherwise described herein.

Those skilled in the art will recognize that the boundaries between blocks are merely illustrative and that alternative embodiments may merge blocks or circuit elements or impose an alternate decomposition of functionality upon various logic blocks or circuit elements. Thus, it is to be understood that the architectures depicted herein are merely exemplary, and that in fact many other architectures may be implemented which achieve the same functionality.

Any arrangement of components to achieve the same functionality is effectively "associated" such that the desired functionality is achieved. Hence, any two components herein combined to achieve a particular functionality may be seen as "associated with" each other such that the desired functionality is achieved, irrespective of architectures or intermedial components. Likewise, any two components so associated can also be viewed as being "operably connected," or "operably coupled," to each other to achieve the desired functionality.

Furthermore, those skilled in the art will recognize that boundaries between the above described operations merely illustrative. The multiple operations may be combined into a single operation, a single operation may be distributed in additional operations and operations may be executed at least partially overlapping in time. Moreover, alternative embodiments may include multiple instances of a particular operation, and the order of operations may be altered in various other embodiments.

However, other modifications, variations and alternatives are also possible. The specifications and drawings are, accordingly, to be regarded in an illustrative rather than in a restrictive sense.

In the claims, any reference signs placed between parentheses shall not be construed as limiting the claim. The word 'comprising' does not exclude the presence of other elements or steps then those listed in a claim. Furthermore, the terms "a" or "an," as used herein, are defined as one or more than one. Also, the use of introductory phrases such as "at least one" and "one or more" in the claims should not be construed to imply that the introduction of another claim element by the indefinite articles "a" or "an" limits any particular claim containing such introduced claim element to inventions containing only one such element, even when the same claim includes the introductory phrases "one or more" or "at least one" and indefinite articles such as "a" or "an." The same holds true for the use of definite articles. Unless stated otherwise, terms such as "first" and "second" are used to arbitrarily distinguish between the elements such terms describe. Thus, these terms are not necessarily intended to indicate temporal or other prioritization of such elements. The mere fact that certain measures are recited in mutually different claims does not indicate that a combination of these measures cannot be used to advantage.

While certain features of the invention have been illustrated and described herein, many modifications, substitutions, changes, and equivalents will now occur to those of ordinary skill in the art. It is, therefore, to be understood that the appended claims are intended to cover all such modifications and changes as fall within the true spirit of the invention.

I claim:

1. A method for aligning a laser unit to a waveguide unit, the method comprising:
   placing the laser unit in a tested position in which the laser unit faces the waveguide unit;
   supplying light, via a coupler of the waveguide unit, to an alignment waveguide of the waveguide unit;
   receiving light emitted from the alignment waveguide; wherein the light was emitted as result of the supplying of the light;
   determining whether the light emitted from the alignment comprises a spectral signature associated with an alignment unit of the laser unit; and
   estimating whether the laser unit is aligned to the waveguide unit based on the determining; and
   wherein the alignment unit is a first Bragg grating and wherein the method comprises attenuating light that passed through the first Bragg grating by a second Bragg grating.

2. The method according to claim 1 wherein the supplying of the light and the receiving of the light while the laser unit is deactivated.

3. The method according to claim 1 comprising changing the tested position and jumping to supplying the light when determining that the laser unit is misaligned to the waveguide unit.

4. The method according to claim 1 further comprising evaluating an amount of light that exited the coupler of the waveguide unit.

5. The method according to claim 1 wherein the alignment unit differs from a laser of the laser unit.

6. The method according to claim 1 wherein the alignment unit is the laser of the laser unit.

7. The method according to claim 1 wherein the alignment waveguide differs from a main waveguide that is allocated for conveying radiation transmitted from the laser of the laser unit.

8. The method according to claim 1 further comprising attenuating light that passed through the alignment unit.

9. The method according to claim 1 further comprising attenuating light that passed through the alignment unit by an attenuating material that follows the alignment unit.

10. The method according to claim 1 further comprising attenuating light that passed through the alignment unit by a scattering element that follows the alignment unit.

11. The method according to claim 1 further comprising attenuating light that passed through the alignment unit by a termination of a laser unit alignment waveguide after the alignment unit.

12. The method according to claim 1 comprising gluing the laser unit to a laser carrier following a completion of an alignment of the laser unit to the waveguide unit.

13. A device, comprising a laser unit and a waveguide unit;
wherein the laser unit comprises a laser and an alignment unit;
wherein the waveguide unit comprises an alignment waveguide and a coupler;
wherein the coupler is configured to receive light from a light source and to provide the light to the alignment waveguide;
wherein the alignment waveguide is configured to direct the light towards the laser unit;
wherein when aligned to the waveguide unit the alignment unit is configured to reflect light having a spectral signature of the alignment unit towards the alignment waveguide;
wherein when misaligned to the waveguide unit the laser unit is configured to reflect light without the spectral signature of the alignment unit towards the alignment waveguide;
wherein the alignment waveguide is configured to direct the reflected light towards the coupler;
wherein the coupler is configured to direct the reflected light towards a detector; and
wherein the alignment unit is a first Bragg grating and wherein the method comprises attenuating light that passed through the first Bragg grating by a second Bragg grating.

14. The device according to claim 13 wherein the supplying of the light and the receiving of the light while the laser unit is deactivated.

15. The device according to claim 13 comprising changing a tested position and jumping to supplying the light when determining that the laser unit is misaligned to the waveguide unit.

16. The device according to claim 13 further comprising evaluating an amount of light that exited the coupled of the waveguide unit.

17. The device according to claim 13 wherein the alignment unit differs from a laser of the laser unit.

18. The device according to claim 13 wherein the alignment unit is the laser of the laser unit.

19. The device according to claim 13 wherein the alignment waveguide differs from a main waveguide that is allocated for conveying radiation transmitted from the laser of the laser unit.

20. The device according to claim 13 further comprising attenuating light that passed through the alignment unit.

21. The device according to claim 13 further comprising attenuating light that passed through the alignment unit by an attenuating material that follows the alignment unit.

22. The device according to claim 13 further comprising attenuating light that passed through the alignment unit by a scattering element that follows the alignment unit.

23. The device according to claim 13 further comprising attenuating light that passed through the alignment unit by a termination of a laser unit alignment waveguide after the alignment unit.

24. The device according to claim 13 comprising gluing the laser unit to a laser carrier following a completion of an alignment of the laser unit to the waveguide unit.

* * * * *